United States Patent
Baker et al.

(10) Patent No.: US 9,340,415 B2
(45) Date of Patent: May 17, 2016

(54) MEMS DEVICE WITH NON-PLANAR FEATURES

(71) Applicant: TEXAS INSTRUMENTS INCORPORATED, Dallas, TX (US)

(72) Inventors: James C. Baker, Coppell, TX (US); Patrick I. Oden, McKinney, TX (US); Robert S. Black, Irving, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/661,830

(22) Filed: Mar. 18, 2015

(65) Prior Publication Data

US 2015/0266727 A1 Sep. 24, 2015

Related U.S. Application Data

(60) Provisional application No. 61/954,719, filed on Mar. 18, 2014.

(51) Int. Cl.
*B81C 1/00* (2006.01)

(52) U.S. Cl.
CPC ......... *B81C 1/00626* (2013.01); *B81C 1/00198* (2013.01); *B81C 1/00404* (2013.01); *B81C 2201/0198* (2013.01)

(58) Field of Classification Search
None
See application file for complete search history.

(56) References Cited

U.S. PATENT DOCUMENTS

| | | | |
|---|---|---|---|
| 5,454,906 A * | 10/1995 | Baker | G03F 7/00 216/2 |
| 5,935,876 A * | 8/1999 | Lee | H01L 21/02126 257/E21.271 |
| 6,960,305 B2 | 11/2005 | Doan et al. | |
| 7,317,232 B2 | 1/2008 | Busta | |
| 7,576,902 B2 | 8/2009 | Neidrich et al. | |
| 2012/0236369 A1 * | 9/2012 | Pasupuleti | G06K 17/00 358/474 |
| 2013/0000119 A1 * | 1/2013 | Tai | A61K 9/0024 29/888.02 |

* cited by examiner

*Primary Examiner* — Shamim Ahmed
(74) *Attorney, Agent, or Firm* — Michael A. Davis, Jr.; Frank D. Cimino (57) ABSTRACT

A MEMS device is formed with facing surfaces of a contoured substrate and a layer of material having complementary contours. In one fabrication approach, a first photoresist layer is formed over a substrate. Selected regions of the first photoresist layer are exposed using a patterning mask. The exposed regions of the first photoresist layer are thermally shrunk to pattern the first photoresist layer with a contour. A layer of material is formed over the contoured first photoresist layer.

15 Claims, 8 Drawing Sheets

MEMS DEVICE WITH NON-PLANAR FEATURES

CROSS REFERENCE TO RELATED APPLICATIONS

This application claims the benefit of priority under U.S.C. §119(e) of U.S. Provisional Application 61/954,719, filed Mar. 18, 2014, which is hereby incorporated by reference in its entirety.

FIELD OF THE INVENTION

This relates to microelectromechanical system (MEMS) devices and their fabrication.

BACKGROUND

MEMS devices often include one or more mechanically movable elements supported in spaced position above circuitry or other components of an underlying substrate. An example such device is a digital micromirror device (DMD) device which has movable mirror elements supported in spaced position above respective mirror positioning circuit elements formed on an underlying substrate. Another example is a pressure sensor device which has a movable membrane supported in spaced position above membrane displacement detection circuitry. Another example is a switching device such as shown in U.S. Pat. No. 7,317,232 B2.

The fabrication of such devices typically involves the formation of a layer of photoresist or other sacrificial material as a spacer layer over the substrate and formation of the movable element by one or more layers of metal or other material deposited over the spacer layer. Following formation of the movable element, the spacer layer is removed to leave the gap between the movable element and the substrate. In many such devices, the spacer layer is patterned with vias or similar openings prior to deposit of the movable element layers to enable formation of the support structure for the movable element prior to removal of the spacer layer and at the same time as the movable portion is formed. Examples of such fabrication are given in U.S. Pat. No. 6,960,305 B2, U.S. Pat. No. 7,317,232 B2 and U.S. Pat. No. 7,576,902 B2, the entireties of all of which are incorporated by reference herein.

When constructing MEMS device elements that are spaced by a gap from other parts of the MEMS device structure using the described techniques, control of the spaced element formation is typically limited to variations in the coating thickness of the sacrificial material layer level (vertically) and the ability to selectively etch different materials composing the vertical stack. This may not be overly restrictive for the formation of planar features, but may present challenges for the formation of corrugated or other non-planar features.

Single- or bi-axis stiffening or softening may be useful for thin film spaced MEMS device elements.

Figure 1:
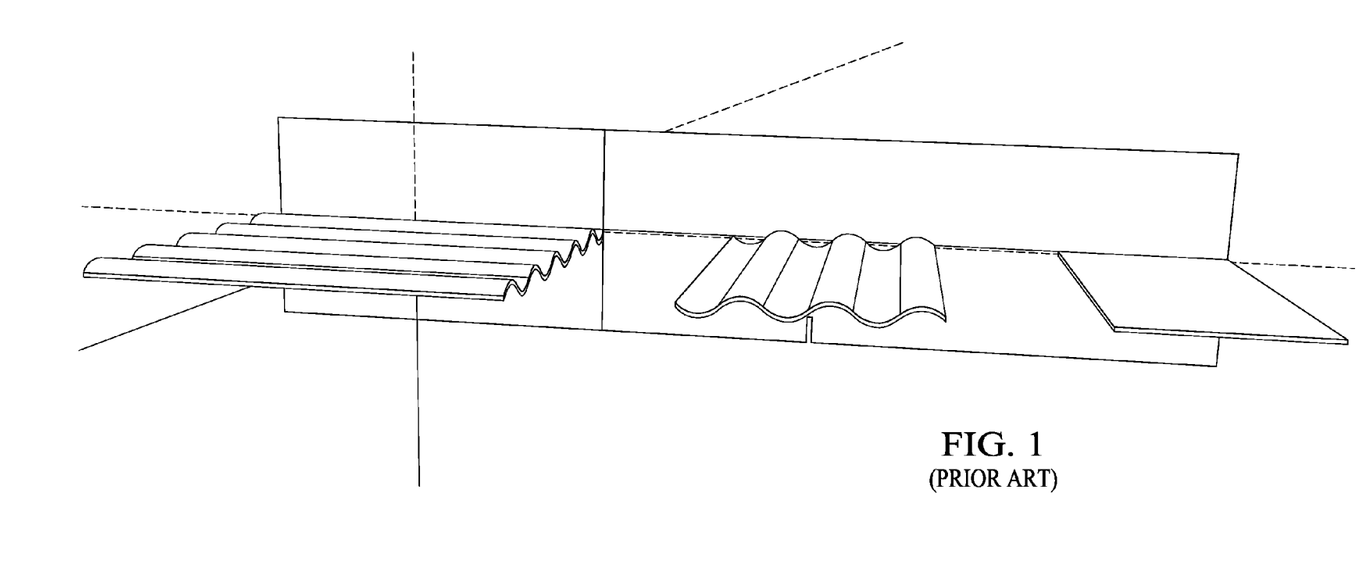
FIG. 1 shows perspective views of example thin film cantilever structures.

FIG. 1 illustrates examples of thin film non-planar cantilever structures having oppositely directed corrugations as well as a simple planar cantilever structure shown for comparison purposes. In the leftmost member, the corrugations run parallel to the line of attachment with the supporting structure so act to soften the cantilever and encourage vibrational flexing. In the center member, on the other hand, the corrugations run perpendicular to the line of attachment so act to stiffen the cantilever and resist vibrational flexing.

Figure 2A:
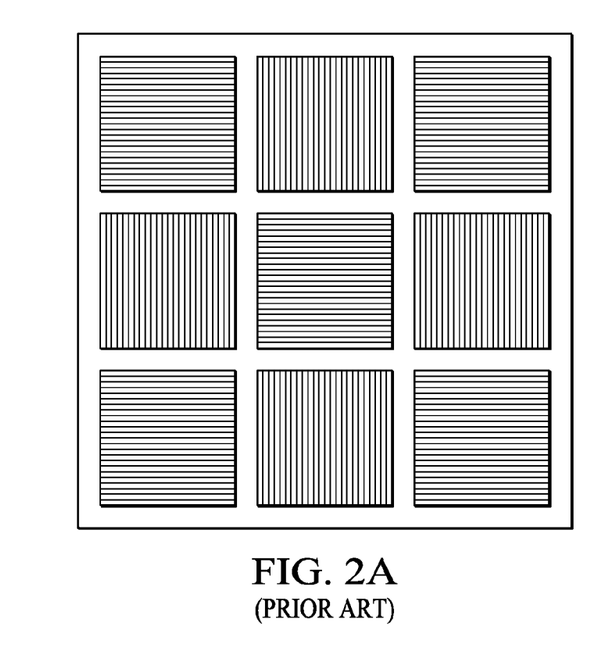
FIGS. 2A and 2B show top views of two-dimensional stiffness structures.
Figure 2B:
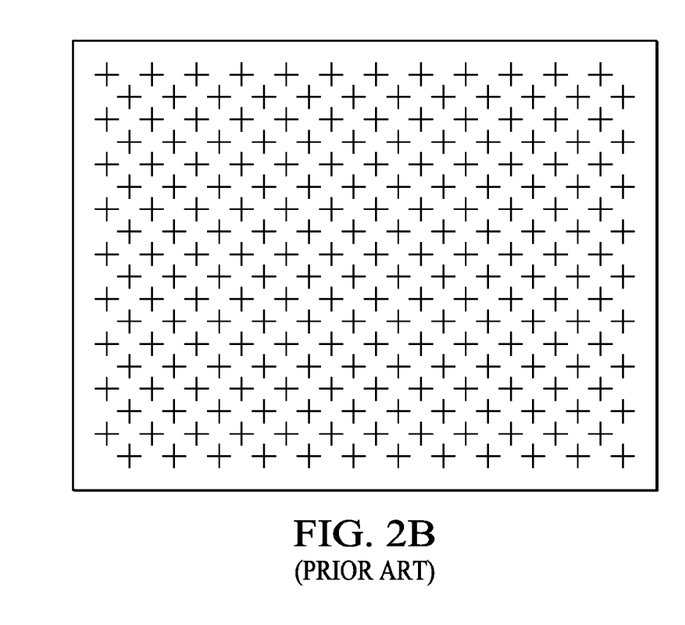

FIGS. 2A and 2B illustrate two approaches for providing two dimensional stiffness using bi-directional corrugations. Lines in the figure indicate topographically lower feature elevations. The member shown in FIG. 2A uses a modular approach with alternating regions of parallel and perpendicular corrugations. The member shown in FIG. 2B uses a more localized structure with defined points of criss-crossed parallel and perpendicular corrugation intersections.

Non-planar features may also be useful to impart anti-stiction characteristics to the movable elements. Bumps and similar features known for this purpose are, however, significantly larger than the non-planar features addressed herein.

SUMMARY

MEMS devices with non-planar features and methods for their fabrication are provided.

In an example implementation, a MEMS device is formed with facing surfaces of a contoured substrate and a layer of material having complementary contours. In one fabrication approach, a first photoresist layer is formed over a substrate. Selected regions of the first photoresist layer are exposed using a patterning mask. The exposed regions of the first photoresist layer are thermally shrunk to pattern the first photoresist layer with a contour. A layer of material is formed over the contoured first photoresist layer.

In example implementations, the contour may comprise a series of parallel ridges and grooves. The ridges and grooves of the series may be spaced at equal intervals. The contour may comprise a plurality of areas, each area having a series of parallel ridges and grooves; wherein the ridges and grooves of a first area are orthogonal to the ridges and grooves of the second area. The contour may comprise a multiplicity of areas, each area having a series of parallel ridges and grooves; and wherein the ridges and grooves of each area are orthogonal to the ridges and grooves of adjacent areas. The contour may comprise a first plurality of parallel ridges and grooves and a second plurality of parallel ridges and grooves, the second plurality of ridges and grooves being orthogonal to the first plurality of ridges and grooves. Ones of the first plurality of ridges and grooves may intersect with ones of the second plurality of ridges and grooves.

DETAILED DESCRIPTION OF EXAMPLE EMBODIMENTS

Example embodiments are described in the context of an application for providing MEMS elements with non-planar surface features for providing enhanced proximity of electrodes through complementary patterning. Such implementation may be advantageous, for example, to enhance differential capacitance in MEMS switches.

In an example implementation, a MEMS device is formed with facing surfaces of a contoured substrate and a contact layer having complementary contours.

Figure 3A:
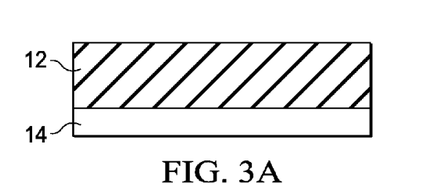
FIGS. 3A-3K are cross-sectional views of an example MEMS device as various stages of fabrication.
Figure 3B:
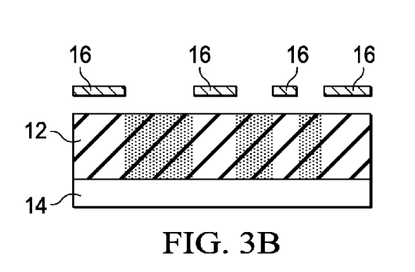
Figure 3C:
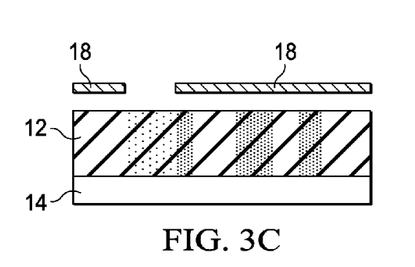
Figure 3D:
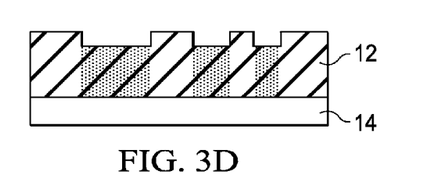
Figure 3E:
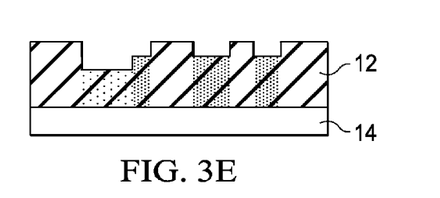
Figure 3F:
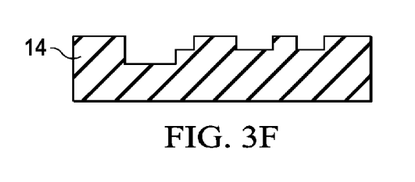

As illustrated in FIG. 3A, a first photoresist layer 12 is formed over a substrate 14. Selected regions of the first photoresist layer 12 are exposed using a patterning mask 16 as shown in FIG. 3B. Layer 12 may then optionally be exposed to one or more additional patterning masks 18 as appropriate to suit individual specific patterning needs and/or preferences as shown in FIG. 3C. Exposure of resist through the single mask 16 yields vertical features after thermal processing. With additional mask exposures, more complicated features (e.g., tapers/slopes) may produced. The exposed regions of first photoresist layer 12 are then thermally shrunk to pattern the first photoresist layer with a contour as shown in FIG. 3D (for single mask 16 exposure) or FIG. 3E (for double mask 16,18 exposure). This may be accomplished after exposure by subjecting the photoresist layer to a heat treatment to thermally shrink the photoresist layer. During this heat treatment, the previously exposed regions of the photoresist layer shrink to a greater extent that the non-exposed regions and multiple exposed regions shrink to a greater extent that single exposed regions. The patterned photoresist layer 12 is then etched to transfer the contour to the underlying substrate 14 as shown in FIG. 3F.

Figure 3G:
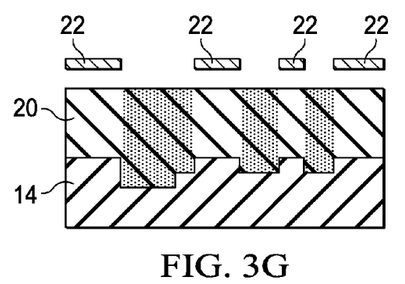
Figure 3H:
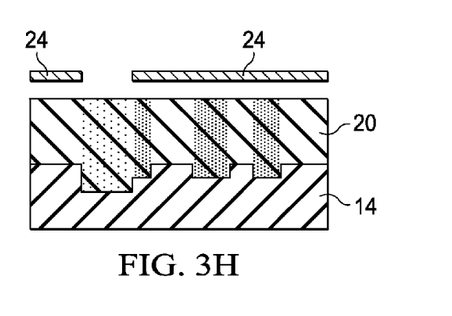
Figure 3I:
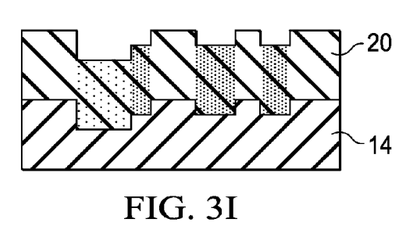

Next, a second photoresist layer 20 is formed over the contoured substrate 14 and selected regions of the second photoresist layer 20 are then exposed to a patterning mask 22 as shown in FIG. 3G. As before, the layer 20 may then optionally be exposed to one or more additional patterning masks 24 as shown in FIG. 3H. To achieve complementary contouring in the described example, masks 22, 24 may be identical or similar to the masks 16, 18 used to expose the first photoresist layer 12. For different or additional contouring, the masks 22, 24 and regions selected for exposure may be different. The exposed selected regions of the second photoresist layer 20 are then thermally shrunk to pattern the second photoresist layer 20 with the contour as shown in FIG. 3I.

Figure 3J:
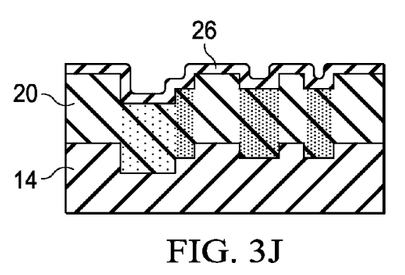

Next, as shown in FIG. 3J, one or more layers of spaced element (e.g., movable MEMS element) forming material 26 are formed over the contoured second photoresist layer 20 and patterned to form the MEMS element spaced by a gap above the contoured substrate 14. Material 26 may comprise conducting or insulating materials suitable for forming a moveable MEMS element such as Al and its alloys, TiN, SiN, AlOx, etc. Use of the same mask for exposing the first and second photoresist layers 12, 20 results in formation of complimentary patterns on opposing surfaces of the spaced MEMS element and the substrate. The undersurface of the spaced MEMS element has its contouring defined by the upper surface of the second photoresist layer 20 over which the one or more layers of spaced element forming material 26 are deposited. The upper surface of the substrate 14 has its contouring defined by the upper surface of the first photoresist layer 12 which was transferred to the substrate through etching.

Figure 3K:
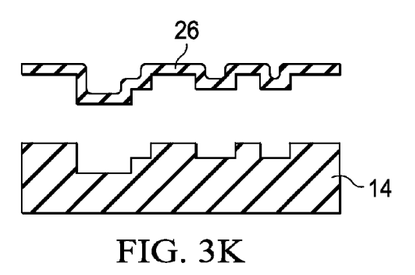

Following formation of the spaced MEMS element by depositing and patterning the layer or layers 26, the second photoresist layer 20 which serves as a sacrificial spacer layer is removed as shown in FIG. 3K. Removal of layer 20, which may optionally be postponed until completion of additional processing and packaging steps, releases the spaced element 26 for movement relative to the substrate.

Figure 4A:
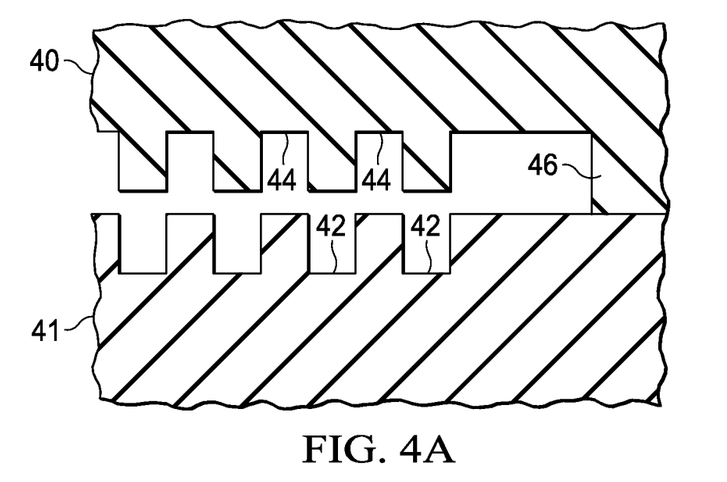
FIGS. 4A and 4B illustrate application of the method of FIGS. 3A-3J in the formation of a MEMS switching device.
Figure 4B:
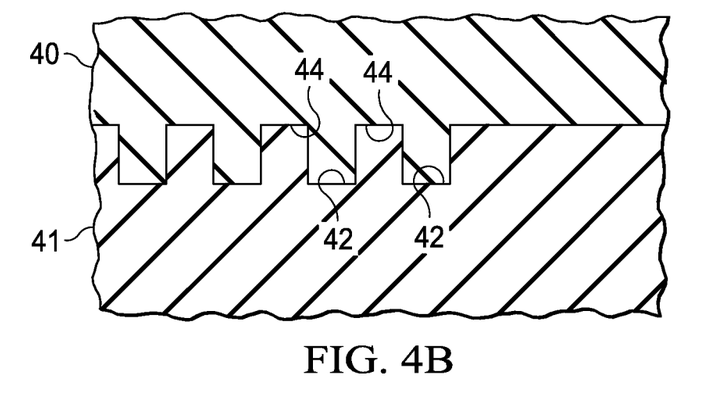

FIGS. 4A and 4B illustrate the application of the described process for formation of a movable element 40 of a MEMS switching device such as illustrated in FIG. 1 of previously referenced U.S. Pat. No. 7,317,232 B2. Here, the upper surface of substrate 41 has a serrated contour formed by etching a series of trenches 42 to transfer a pattern formed in a first photoresist layer 10 through the use of one or more masks 16, 18 as described. The lower surface of movable element 26 is provided with a complementary serrated contour defined by trench-matching protrusions 44 formed by depositing one or more moveable element forming layers 26 into a pattern formed in a second photoresist layer 20 through the use of one or more masks 22, 24.

For the illustrated arrangement, formation of the element 40 includes the simultaneous formation of a via support structure 46 for supporting a movable portion of element 40 in spaced cantilever position above the matching underlying portion of substrate 41. The via support 46 may, for example, be formed by a separate mask 24 enabling the use of the same or similar patterning for mask 22 as for mask 16; or may, alternatively, be formed using a modified form of mask 16 as the mask 22. Also, substrate etch parameters may be controlled or masking patterns modified to enable clearance for the angular travel of protrusions 44 into and out of trenches 42 during pivotal movement of the cantilever relative to the via support 46. FIG. 4A shows the MEMS device structure with the movable element 40 in its upward, switch open position. FIG. 4B shows the structure with element 40 in its downward, switch closed position. The relative open and closed position via support vertical dimensions are exaggerated to more clearly illustrate the disengagement/engagement of the trenches 44 and protrusions 42 in FIGS. 4A and 4B.

Figure 5A:
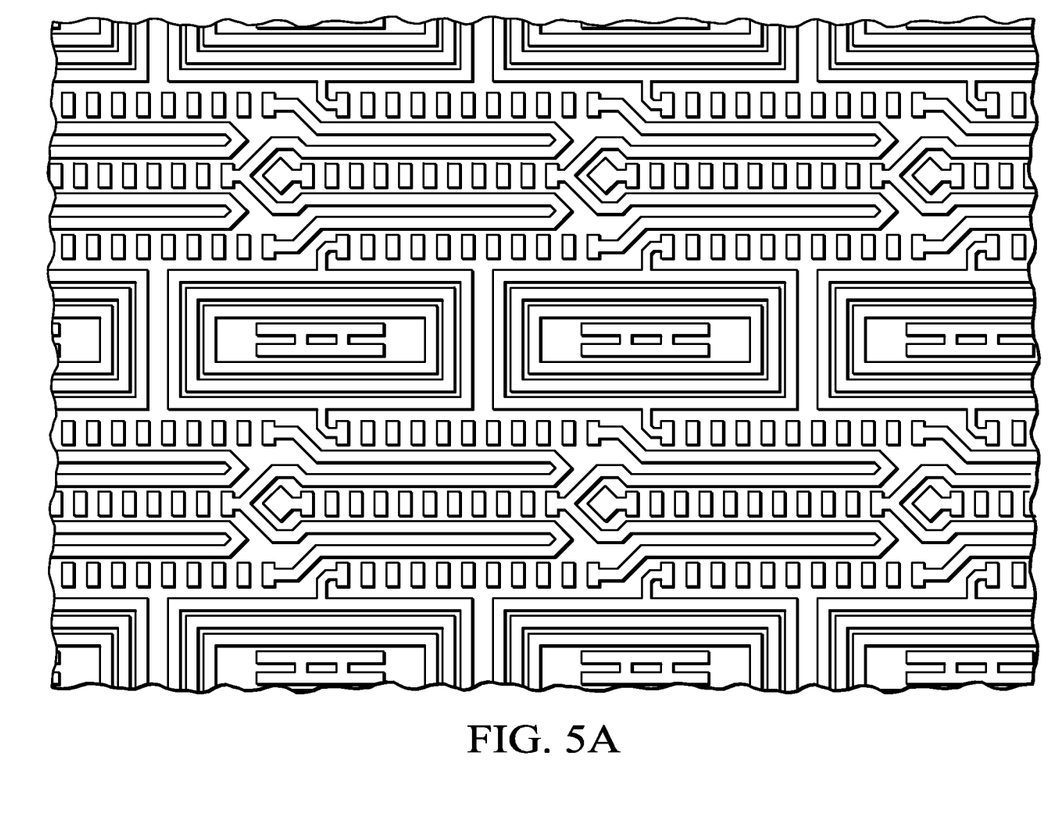
FIGS. 5A-5C illustrate an example implementation of a mask shown in top view in FIG. 5A to create features of a MEMS device shown in top view in FIG. 5B and perspective view in FIG. 5C.
Figure 5B:
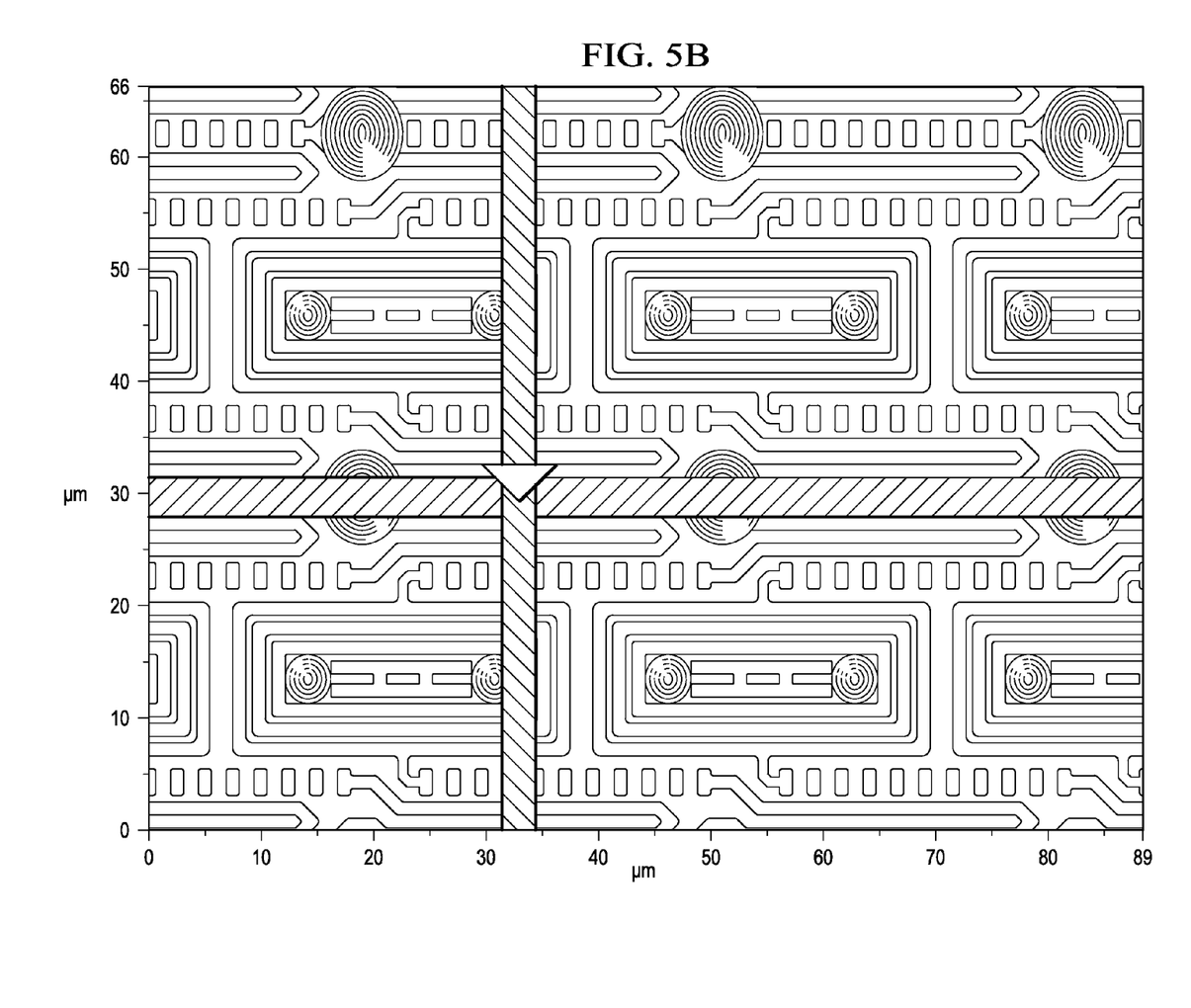
Figure 5C:
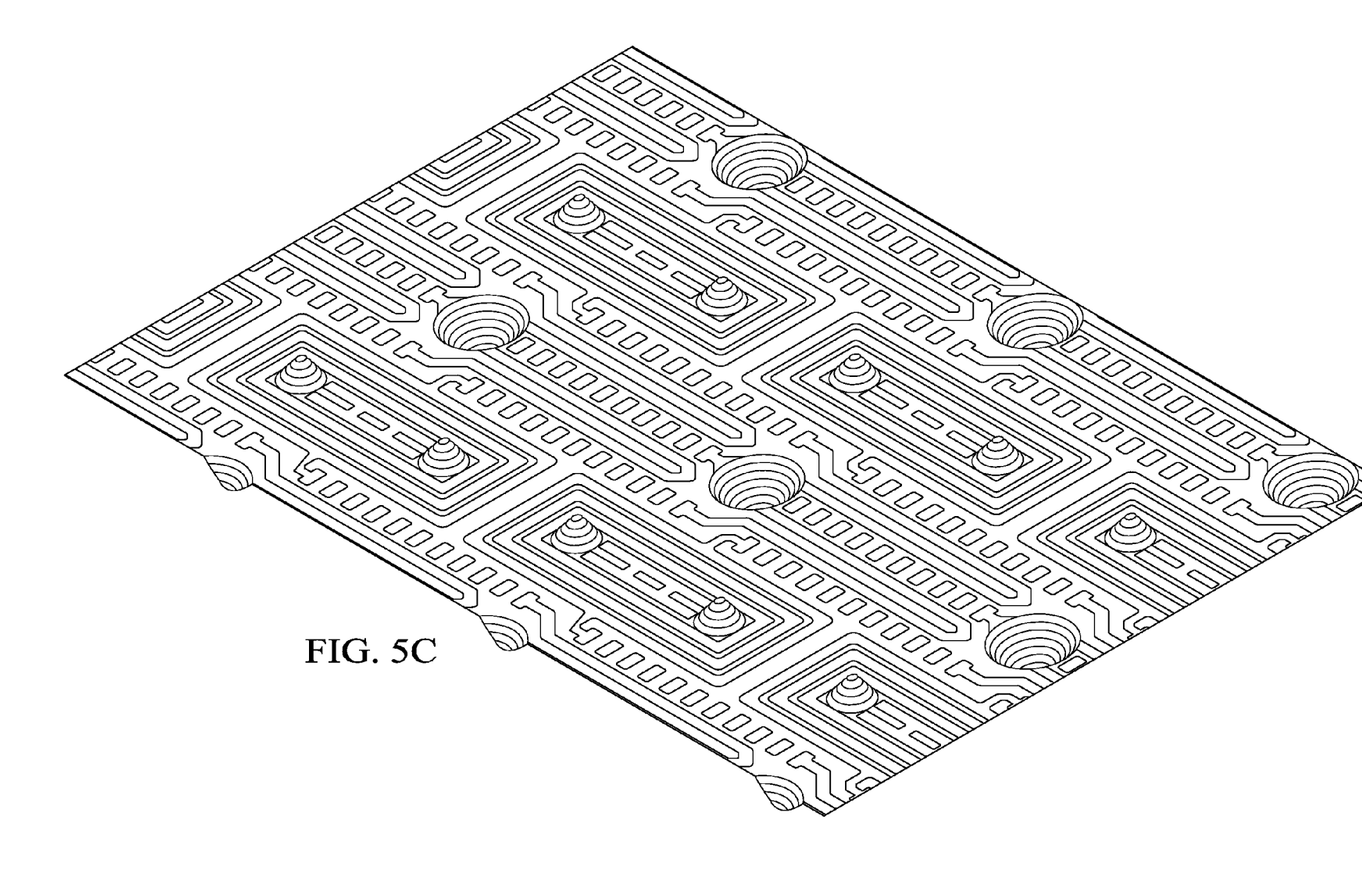

FIGS. 5A-5C illustrate an example implementation of a mask shown in FIG. 5A to create features of a MEMS device shown in FIGS. 5B and 5C. FIG. 5B shows the ready applicability of the described approach to produce a variety of lateral dimensions with little effort (scale in microns). FIG. 5C shows the ready achievement of vertical dimensions (viz., corrugation amplitudes) of 10 nm-250 nm.

Those skilled in the art to which the invention relates will appreciate that modifications may be made to the described embodiments, and also that many other embodiments are possible, within the scope of the claimed invention.

What is claimed is:

1. A method of forming a MEMS device, comprising:
   forming a photoresist layer over a substrate after the substrate is a contoured substrate;
   exposing selected regions of the photoresist layer using a mask;
   thermally shrinking the photoresist layer such that exposed regions of the photoresist layer form a contour in the photoresist layer; and
   forming a layer of material over the contoured photoresist layer;
   wherein facing surfaces of the contoured substrate and the layer of material have complementary contours.

2. The method of claim 1, wherein the photoresist layer is a second photoresist layer, and the method further comprises:
   prior to forming the second photoresist layer, forming a first photoresist layer over the substrate before the substrate is the contoured substrate;
   exposing selected regions of the first photoresist layer using a mask;
   thermally shrinking the first photoresist layer such that the exposed selected regions of the first photoresist layer form the contour in the first photoresist layer; and
   etching the contoured first photoresist layer to transfer the contour to the underlying substrate to form the contoured substrate.

3. The method of claim 1, further comprising removing the contoured photoresist layer after forming the layer of material.

4. The method of claim 2, wherein the mask used to expose the first photoresist layer is the same mask used to expose the second photoresist layer at least in the area of the contour.

5. The method of claim 4, wherein the layer of material is a second layer of material, and the method further comprises forming a first layer of material conformally over the contoured substrate prior to forming the second photoresist layer.

6. The method of claim 5, wherein the first layer of material and the second layer of material comprise conductive material.

7. The method of claim 6, wherein the first layer of material and the second layer of material comprise the same conductive material.

8. The method of claim 7, wherein the same conductive material is selected from the group consisting of Al, Al alloy, TiN, SiN, and AlOx.

9. The method of claim 1, wherein the contour comprises a series of parallel ridges and grooves.

10. The method of claim 9, wherein the ridges and grooves of the series are spaced at equal intervals.

11. The method of claim 10, wherein the contour comprises a plurality of areas, each area having a series of parallel ridges and grooves; and wherein the ridges and grooves of a first area are orthogonal to the ridges and grooves of a second area.

12. The method of claim 10, wherein the contour comprises a multiplicity of areas, each area having a series of parallel ridges and grooves; and wherein the ridges and grooves of each area are orthogonal to the ridges and grooves of adjacent areas.

13. The method of claim 12, wherein ones of the ridges and grooves of a first area intersect with ones of the ridges and grooves of a second area.

14. A method of forming a MEMS device, comprising:
forming a photoresist layer over a contoured substrate;
exposing selected regions of the photoresist layer using a first mask;
exposing a subset of the selected regions of the photoresist layer using a second mask;
thermally shrinking the photoresist layer after exposing the selected regions and exposing the subset of selected regions to form a multilayer contour in the photoresist layer;
forming a layer of material over the multilayer contour in the photoresist layer; and
removing the contoured photoresist layer after forming the layer of material,
wherein facing surfaces of the contoured substrate and the layer of material have complementary contours.

15. A method of forming a MEMS device, comprising:
forming a first photoresist layer over a substrate;
exposing selected regions of the first photoresist layer using a mask;
thermally shrinking the first photoresist layer such that the exposed selected regions of the first photoresist layer form a contour in the first photoresist layer;
etching the contoured first photoresist layer to transfer the contour to the substrate;
forming a second photoresist layer over the contoured substrate;
exposing selected regions of the second photoresist layer using a mask;
thermally shrinking the second photoresist layer such that the exposed selected regions form the contour in the second photoresist layer; and
forming a layer of material over the contoured second photoresist layer;
wherein facing surfaces of the contoured substrate and the layer of material have complementary contours.

* * * * *